(12) United States Patent
Ooi et al.

(10) Patent No.: US 12,543,590 B2
(45) Date of Patent: Feb. 3, 2026

(54) SEMICONDUCTOR DEVICE AND METHOD OF FORMING DUMMY VIAS IN WLP

(71) Applicant: STATS ChipPAC Pte. Ltd., Singapore (SG)

(72) Inventors: Peik Eng Ooi, Singapore (SG); Lee Sun Lim, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 542 days.

(21) Appl. No.: 17/819,738

(22) Filed: Aug. 15, 2022

(65) Prior Publication Data
US 2024/0055374 A1  Feb. 15, 2024

(51) Int. Cl.
*H01L 23/00* (2006.01)

(52) U.S. Cl.
CPC .............. *H01L 24/05* (2013.01); *H01L 24/03* (2013.01); *H01L 24/11* (2013.01); *H01L 24/13* (2013.01); *H01L 2224/02235* (2013.01); *H01L 2224/02311* (2013.01); *H01L 2224/0239* (2013.01); *H01L 2224/024* (2013.01); *H01L 2224/03013* (2013.01); *H01L 2224/0401* (2013.01); *H01L 2224/05611* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/11849* (2013.01); *H01L 2224/13111* (2013.01); *H01L 2224/13113* (2013.01); *H01L 2224/13116* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01)

(58) Field of Classification Search
CPC ......... H01L 24/05; H01L 24/03; H01L 24/13; H01L 2224/02235; H01L 2224/02311
See application file for complete search history.

(56) References Cited

U.S. PATENT DOCUMENTS

| | | | |
|---|---|---|---|
| 7,229,745 B2 | 6/2007 | Lamarre | |
| 8,202,800 B2 | 6/2012 | Chen et al. | |
| 9,318,442 B1 | 4/2016 | Chen et al. | |
| 10,332,843 B2 | 6/2019 | Baek et al. | |
| 2001/0054766 A1* | 12/2001 | Dirahoui | H01L 23/5329 257/E23.167 |
| 2016/0093572 A1* | 3/2016 | Chen | H01L 23/5389 438/126 |
| 2023/0060249 A1* | 3/2023 | Lai | H01L 23/522 |

* cited by examiner

*Primary Examiner* — Mohammad M Choudhry
(74) *Attorney, Agent, or Firm* — Robert D. Atkins; PATENT LAW GROUP: Atkins and Associates, P.C.

(57) ABSTRACT

A semiconductor device has a semiconductor substrate and first insulating layer formed over the surface of the semiconductor substrate. A dummy via is formed through the first insulating layer. A second insulating layer is formed over the first insulating layer to fill the dummy via. A first conductive layer is formed over the second insulating layer. A bump is formed over the first conductive layer adjacent to the dummy via filled with the second insulating layer. A second conductive layer is formed over a surface of the semiconductor substrate. The dummy via filled with the second insulating layer relieves stress on the second conductive layer. A plurality of dummy vias filled with the second insulating layer can be formed within a designated via formation area. A plurality of dummy vias filled with the second insulating layer can be formed in a pattern.

33 Claims, 9 Drawing Sheets

SEMICONDUCTOR DEVICE AND METHOD OF FORMING DUMMY VIAS IN WLP

FIELD OF THE INVENTION

The present invention relates in general to semiconductor devices and, more particularly, to a semiconductor device and method of forming dummy vias between or adjacent to bumps in a wafer level package (WLP).

BACKGROUND OF THE INVENTION

Semiconductor devices are commonly found in modern electrical products. Semiconductor devices perform a wide range of functions, such as signal processing, high-speed calculations, transmitting and receiving electromagnetic signals, controlling electrical devices, photo-electric, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

A semiconductor wafer can have digital and analog circuits formed on or within an active surface of the wafer. A plurality of conductive layers and insulating layers is formed over the semiconductor wafer to provide electrical interconnect for the circuits formed on or within the active surface. The conductive layers include power supply layers and electrical interconnect layers to signal transmission. The conductive layers can experience stress, particularly in areas of high metal concentration, leading to interlayer delamination due to interface locking between similar layers. The stress and delamination is more prominent for multi-layer RDL designs.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are disposed on a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
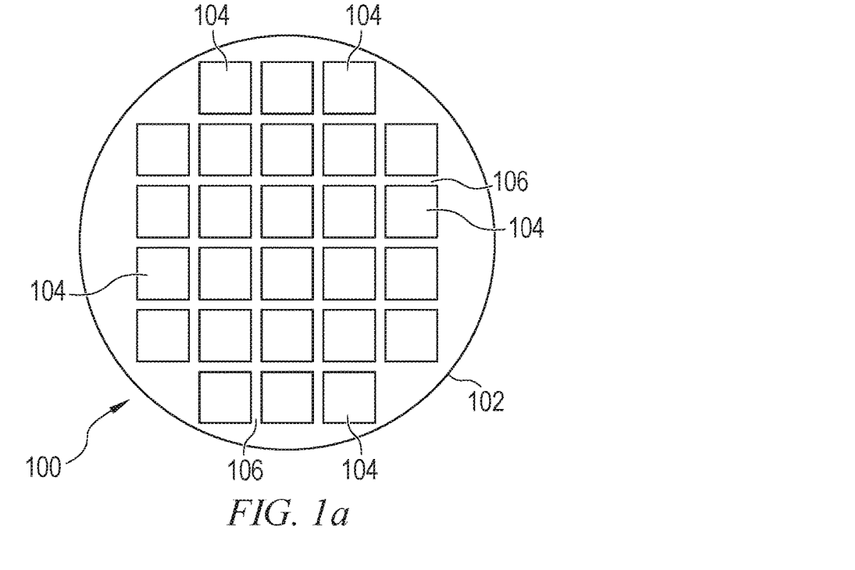
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or electrical components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 2A:
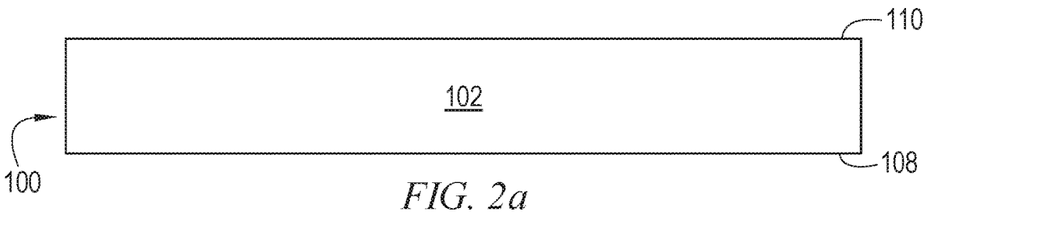
FIGS. 2a-2f illustrate forming a dummy via between or adjacent to bumps.

FIG. 2a shows further detail of a portion of semiconductor wafer 100 with back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as digital signal processor (DSP), application specific integrated circuits (ASIC), memory, or other signal processing circuit. Semiconductor die 104 may also contain IPDs, such as inductors, capacitors, and resistors, for RF signal processing.

Figure 2B:
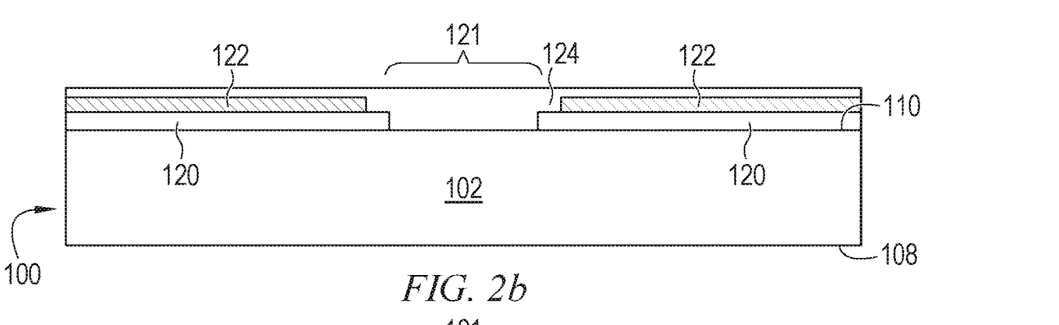

In FIG. 2b, insulating or passivation layer 120 is formed over surface 110 using PVD, CVD, printing, lamination, spin coating, spray coating, sintering or thermal oxidation. Insulating layer 120 contain one or more layers of silicon dioxide (SiO2), silicon nitride (Si3N4), silicon oxynitride (SiON), tantalum pentoxide (Ta2O5), aluminum oxide (Al2O3), photoresist, polyimide, benzocyclobutene (BCB), polybenzoxazoles (PBO), and other material having similar insulating and structural properties. A portion of insulating layer 120 is removed by an etching process to expose surface 110 in designated via formation area 121. Insulating layer 120 is patterned, exposed, and selectively etched to produce designated via formation area 121.

An electrically conductive layer 122 is patterned and selectively formed over insulating layer 120 using PVD, CVD, electrolytic plating, electroless plating process, or other suitable metal deposition process. Conductive layer 122 can be one or more layers of Al, Cu, Sn, Ni, Au, Ag, or other suitable electrically conductive material. Conductive layer 122 operates as a first redistribution layer (RDL) for vertical and horizontal electrical interconnect to the circuits or IPD on active surface 110. In one embodiment, conductive layer 122 provides power supply voltages, such as a positive voltage and ground.

An insulating or passivation layer 124 is formed over conductive layer 122 and insulating layer 120 using PVD, CVD, printing, lamination, spin coating, spray coating, sintering or thermal oxidation. Insulating layer 124 contains one or more layers of SiO2, Si3N4, SiON, Ta2O5, Al2O3, photoresist, polyimide, BCB, PBO, and other material having similar insulating and structural properties. In particular, insulating layer 124 fills in designated via formation area 121.

Figure 2C:
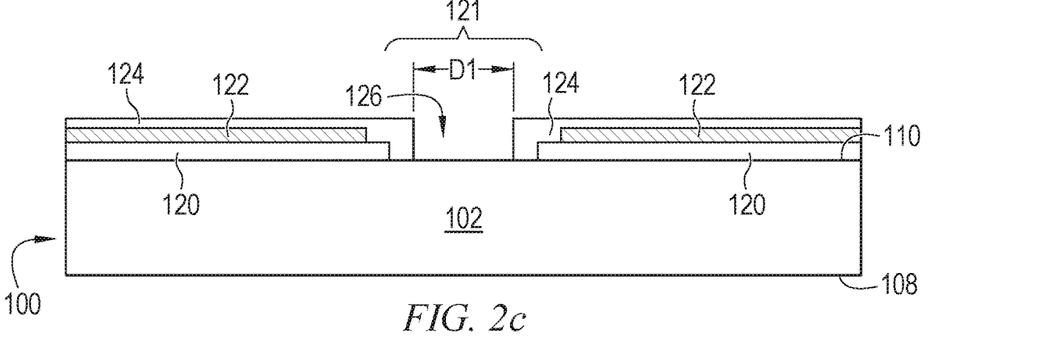

In FIG. 2c, a portion of insulating layer 124 is removed to form opening or via 126. A solder resist or photoresist is formed over insulating layer 124. The photoresist is exposed to provide a pattern to selectively etch insulating layer 124 and form dummy via 126. The remaining photoresist is removed leaving dummy via 126 between or adjacent to later to be formed bumps. In one embodiment, dummy vias 126 has a width or diameter D1 of 50.0 μm.

Figure 2D:
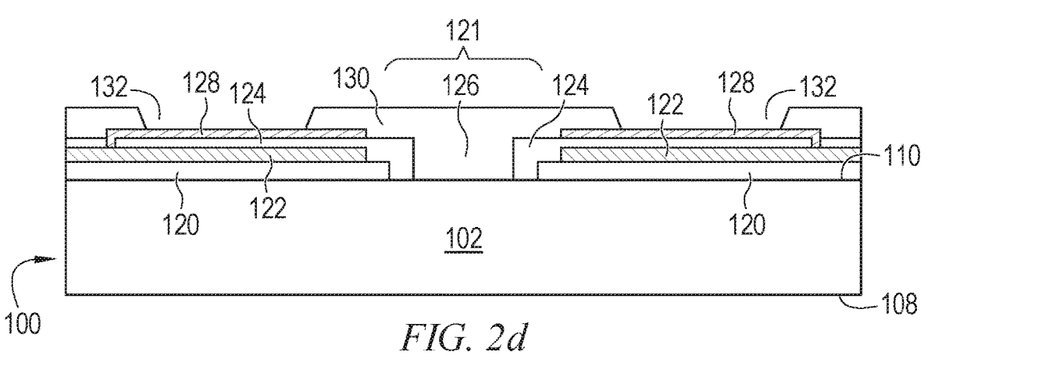

In FIG. 2d, electrically conductive layer 128 is patterned and selectively formed over insulating layer 124 using PVD, CVD, electrolytic plating, electroless plating process, or other suitable metal deposition process. Conductive layer 128 can be one or more layers of Al, Cu, Sn, Ni, Au, Ag, or other suitable electrically conductive material. Conductive layer 128 operates as a second RDL for vertical and horizontal electrical interconnect to the circuits or IPD on active surface 110. In a multi-level interconnect design, additional conductive layers like 128 and insulating layers like 130 can be formed to provide the electrical interconnect capability necessary for the circuits formed within active surface 110.

An insulating or passivation layer 130 is formed over conductive layer 128 and insulating layer 124 using PVD, CVD, printing, lamination, spin coating, spray coating, sintering or thermal oxidation. Insulating layer 130 contains one or more layers of SiO2, Si3N4, SiON, Ta2O5, Al2O3, photoresist, polyimide, BCB, PBO, and other material having similar insulating and structural properties. Notably insulating layer 130 fills dummy via 126. A portion of insulating layer 130 is removed to form opening 132 and expose conductive layer 128, similar to vias 126. Via 126 is a dummy via in that it is formed through insulating layer 124 and then filled with insulating layer 130, i.e., the via has no electrical function.

Figure 2E:
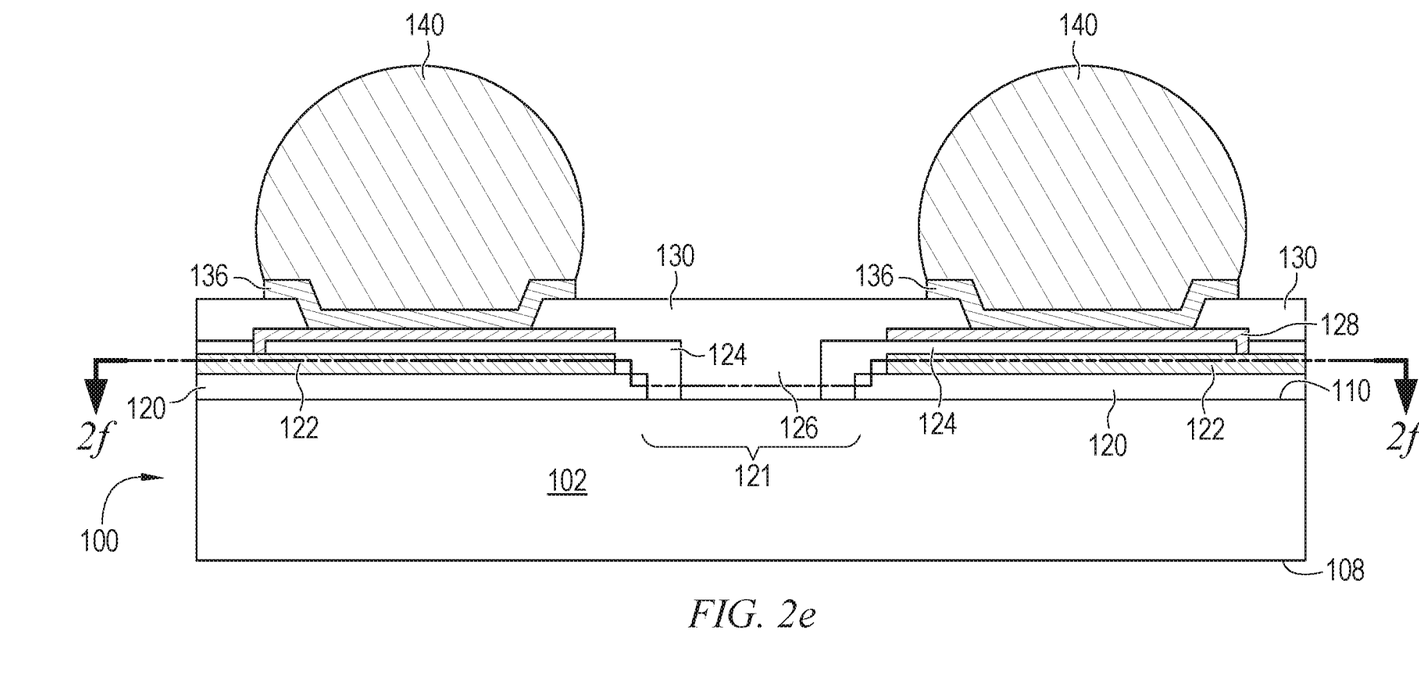

In FIG. 2e, electrically conductive layer 136 is patterned and selectively formed over conductive layer 128 and insulating layer 130 using PVD, CVD, electrolytic plating, electroless plating process, or other suitable metal deposition process. Conductive layer 136 can be one or more layers of Al, Cu, Sn, Ni, Au, Ag, or other suitable electrically conductive material. Conductive layer 136 operates as an under bump metallization (UBM).

An electrically conductive bump material is deposited over conductive layer 136 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 136 using a suitable attachment or bonding process. In one embodiment, the bump material is reflowed by heating the material above its melting point to form balls or bumps 140. Bump 140 is formed over UBM 136 having a wetting layer, barrier layer, and adhesive layer. Bump 140 can also be compression bonded or thermocompression bonded to conductive layer 136. In one embodiment, bump 140 is a copper core bump for durability and maintaining its height. Bump 140 represents one type of interconnect structure that can be formed over conductive layer 136. The interconnect structure can also use bond wires, conductive paste, stud bump, micro bump, or other electrical interconnect.

Figure 2F:
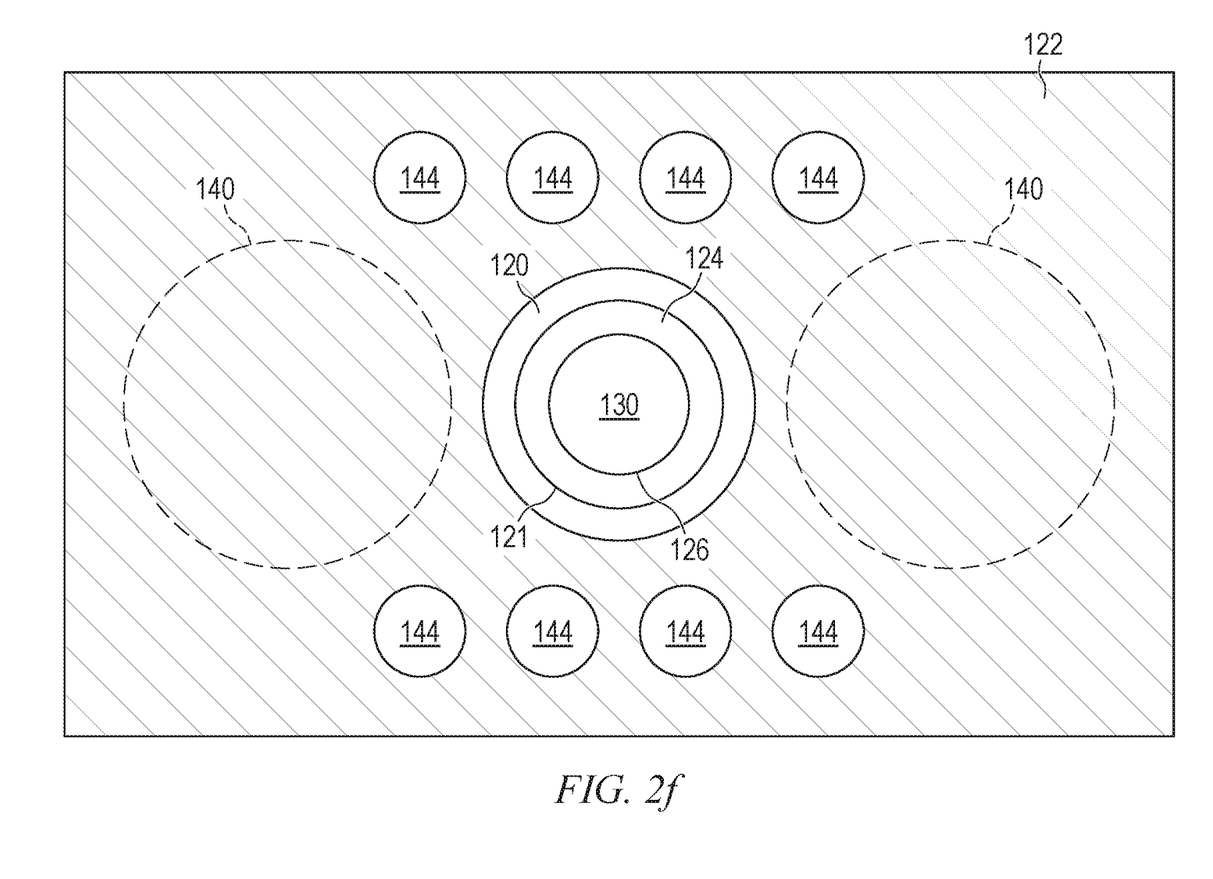

FIG. 2f is a top view of substrate 100 showing insulating layer 120, conductive layer 122, and dummy via 126 formed in insulating layer 124 and filled with insulating layer 130. Substrate 100 represents a wafer level package (WLP) with dummy via 126 between or adjacent to bumps 140. Bumps 140 are shown as a point of reference. Openings or cut-outs 144 are formed in conductive layer 122 for reduction in metal coverage. In particular, dummy via 126 is formed in insulating layer 124 between or adjacent to bumps 140 and then filled with insulating layer 130. Dummy via 126, filled with insulating material, serves to reduce stress and interlayer delamination due to interface locking between similar layers. That is, dummy vias 126 provide a locking effect for insulating layers 120, 124, and 130, leading to less metal coverage and less stress. Cutouts 144 also serve to mitigate delamination and thermal stress due to balancing of metal coverage.

Figure 1B:
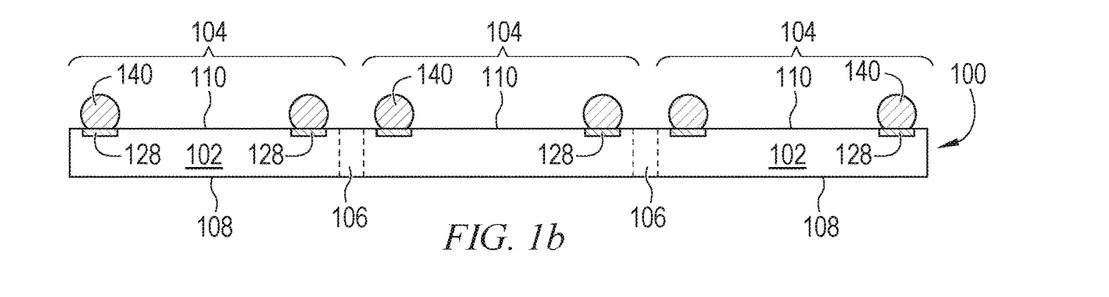
Figure 1C:
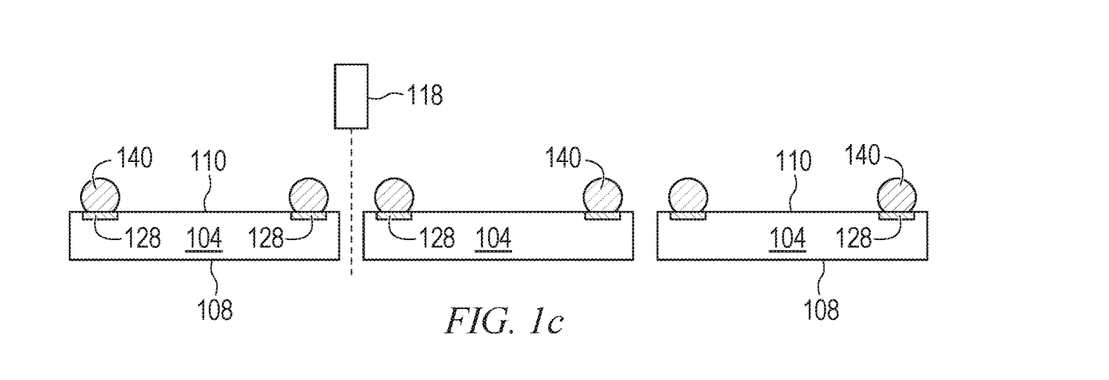

Returning to FIG. 1B, a simplified cross-sectional view of semiconductor wafer 100 is shown, including bumps 140. In FIG. 1c, semiconductor wafer 100 is singulated through saw street 106 using a saw blade or laser cutting tool 118 into individual semiconductor die 104. The individual semiconductor die 104 can be inspected and electrically tested for identification of known good die or unit (KGD/KGU) post singulation.

Figure 3A:
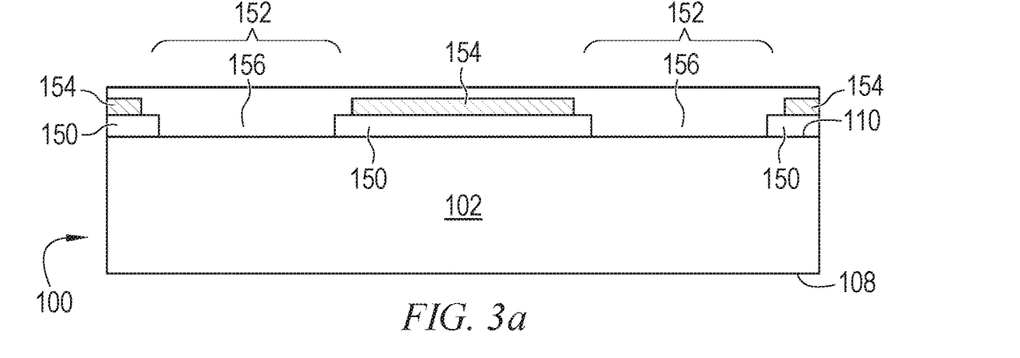
FIGS. 3a-3d illustrate a process of forming a plurality of dummy vias or adjacent to bumps.

In another embodiment, continuing from FIG. 2a, insulating or passivation layer 150 is formed over surface 110 using PVD, CVD, printing, lamination, spin coating, spray coating, sintering or thermal oxidation, as shown in FIG. 3a. Insulating layer 150 contains one or more layers of SiO2, Si3N4, SiON, Ta2O5, Al2O3, photoresist, polyimide, BCB, PBO, and other material having similar insulating and structural properties. A portion of insulating layer 150 is removed by an etching process to expose surface 110 in designated via formation areas 152. Insulating layer 150 is patterned, exposed, and selectively etched to produce designated via formation area 152.

An electrically conductive layer 154 is patterned and selectively formed over insulating layer 150 using PVD, CVD, electrolytic plating, electroless plating process, or other suitable metal deposition process. Conductive layer 154 can be one or more layers of Al, Cu, Sn, Ni, Au, Ag, or other suitable electrically conductive material. Conductive layer 154 operates as a first RDL for vertical and horizontal electrical interconnect to the circuits or IPD on active surface 110. In one embodiment, conductive layer 154 provides power supply voltages, such as a positive voltage and ground.

An insulating or passivation layer 156 is formed over conductive layer 154 and insulating layer 150 using PVD, CVD, printing, lamination, spin coating, spray coating, sintering or thermal oxidation. Insulating layer 156 contains one or more layers of SiO2, Si3N4, SiON, Ta2O5, Al2O3, photoresist, polyimide, BCB, PBO, and other material having similar insulating and structural properties.

Figure 3B:
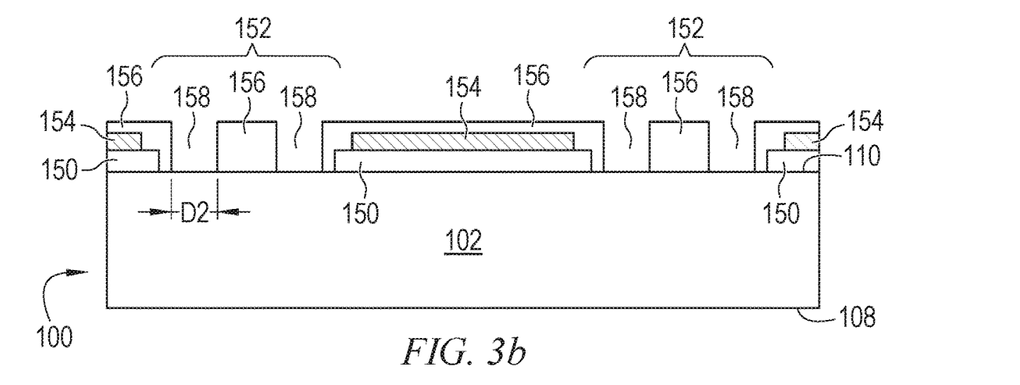

In FIG. 3b, a portion of insulating layer 156 is removed to form a plurality of openings or vias 158 within designated via formation area 152, similar to FIG. 2c. A solder resist or photoresist is formed over insulating layer 156. The photoresist is exposed to provide a pattern to selectively etch insulating layer 124 and form dummy vias 158. The remaining photoresist is removed leaving a plurality of dummy vias 158 within designated via formation area 152 around or adjacent to later to be formed bumps. In one embodiment, dummy vias 158 has a width or diameter D2 of 30.0 µm. Dummy vias 158 are generally smaller than dummy via 126 and represent how multiple dummy vias can be formed in each designated via formation area 152.

Figure 3C:
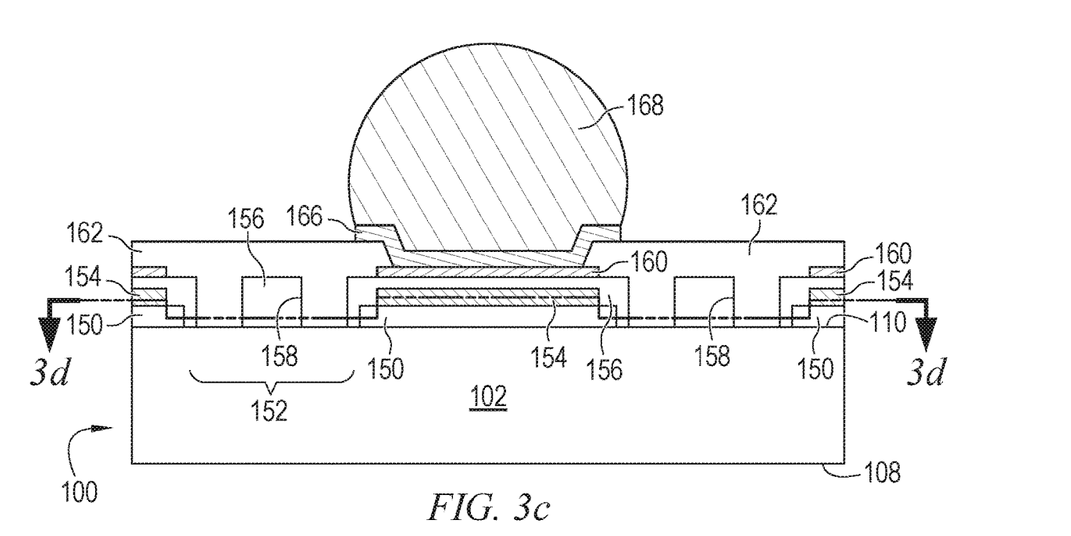

In FIG. 3c, electrically conductive layer 160 is patterned and selectively formed over insulating layer 156 using PVD, CVD, electrolytic plating, electroless plating process, or other suitable metal deposition process. Conductive layer 160 can be one or more layers of Al, Cu, Sn, Ni, Au, Ag, or other suitable electrically conductive material. Conductive layer 160 operates as a second RDL for vertical and horizontal electrical interconnect to the circuits or IPD on active surface 110. There can be multiple conductive layers like 160, each separated by an insulating layer, to provide the electrical interconnect capability for semiconductor die 104.

An insulating or passivation layer 162 is formed over conductive layer 160 and insulating layer 156 using PVD, CVD, printing, lamination, spin coating, spray coating, sintering or thermal oxidation. Insulating layer 162 contain one or more layers of SiO2, Si3N4, SiON, Ta2O5, Al2O3, photoresist, polyimide, BCB, PBO, and other material having similar insulating and structural properties. Notably insulating layer 162 fills dummy vias 158. Via 158 is a dummy via in that it is formed through insulating layer 156 and then filled with insulating layer 162, i.e., the via has no electrical function. A portion of insulating layer 162 is removed to expose conductive layer 160.

An electrically conductive layer 166 is patterned and selectively formed over conductive layer 160 and insulating layer 162 using PVD, CVD, electrolytic plating, electroless plating process, or other suitable metal deposition process. Conductive layer 166 can be one or more layers of Al, Cu, Sn, Ni, Au, Ag, or other suitable electrically conductive material. Conductive layer 166 operates as a UBM.

An electrically conductive bump material is deposited over conductive layer 166 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 166 using a suitable attachment or bonding process. In one embodiment, the bump material is reflowed by heating the material above its melting point to form balls or bumps 168. Bump 168 is formed over UBM 166 having a wetting layer, barrier layer, and adhesive layer. Bump 168 can also be compression bonded or thermocompression bonded to conductive layer 166. In one embodiment, bump 168 is a copper core bump for durability and maintaining its height. Bump 168 represents one type of interconnect structure that can be formed over conductive layer 166. The interconnect structure can also use bond wires, conductive paste, stud bump, micro bump, or other electrical interconnect.

Figure 3D:
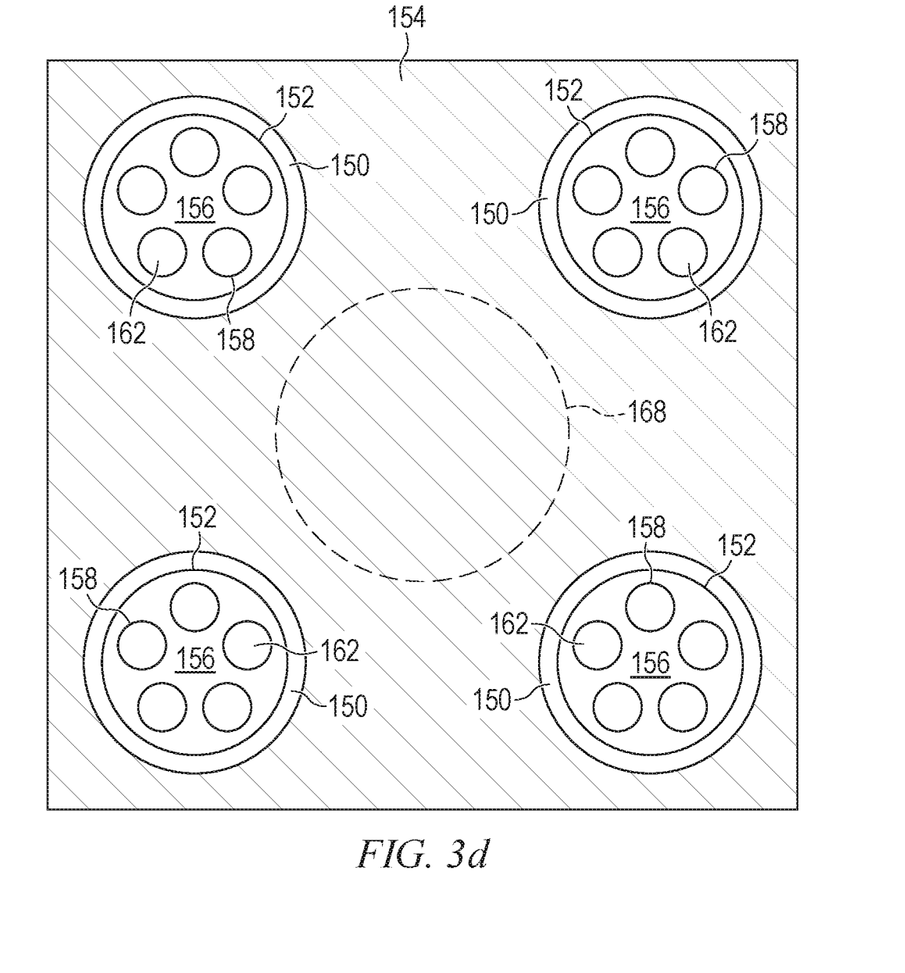

FIG. 3d is a top view of substrate 100 showing insulating layer 150, conductive layer 154, dummy vias 158 formed in insulating layer 156, and dummy vias 158 filled with insulating layer 162 from FIG. 3c. In this case, dummy vias 158 are arranged in a circular pattern within designated via formation area 152, adjacent to bumps 168. Substrate 100 represents a WLP with dummy vias 158 around bumps 168. Bumps 168 are shown as a point of reference.

Figure 4:
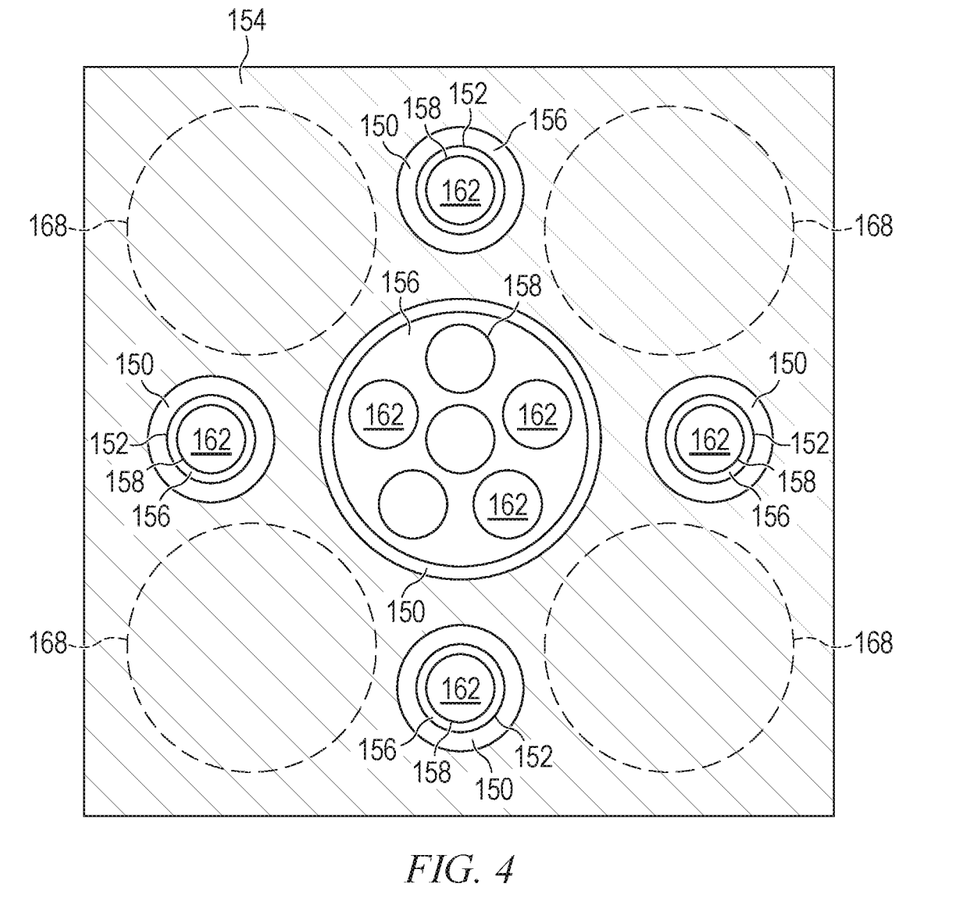
FIG. 4 illustrates an alternate pattern of the dummy vias between or adjacent to bumps.

FIG. 4 is a top view of an alternate embodiment of insulating layer 150, pattern of dummy vias 158 formed in conductive layer 154, insulating layer 156 in dummy vias 158, and bumps 168. FIG. 4 serves to illustrate how the pattern of dummy vias 158 formed between or adjacent to bumps 168 can vary to achieve a reduction of the metal areas, e.g., conductive layer 154. In this case, dummy vias 158 are in part arranged in a circular pattern and further individually arranged adjacent to bumps 168. Bumps 168 are shown as a point of reference.

Figure 5:
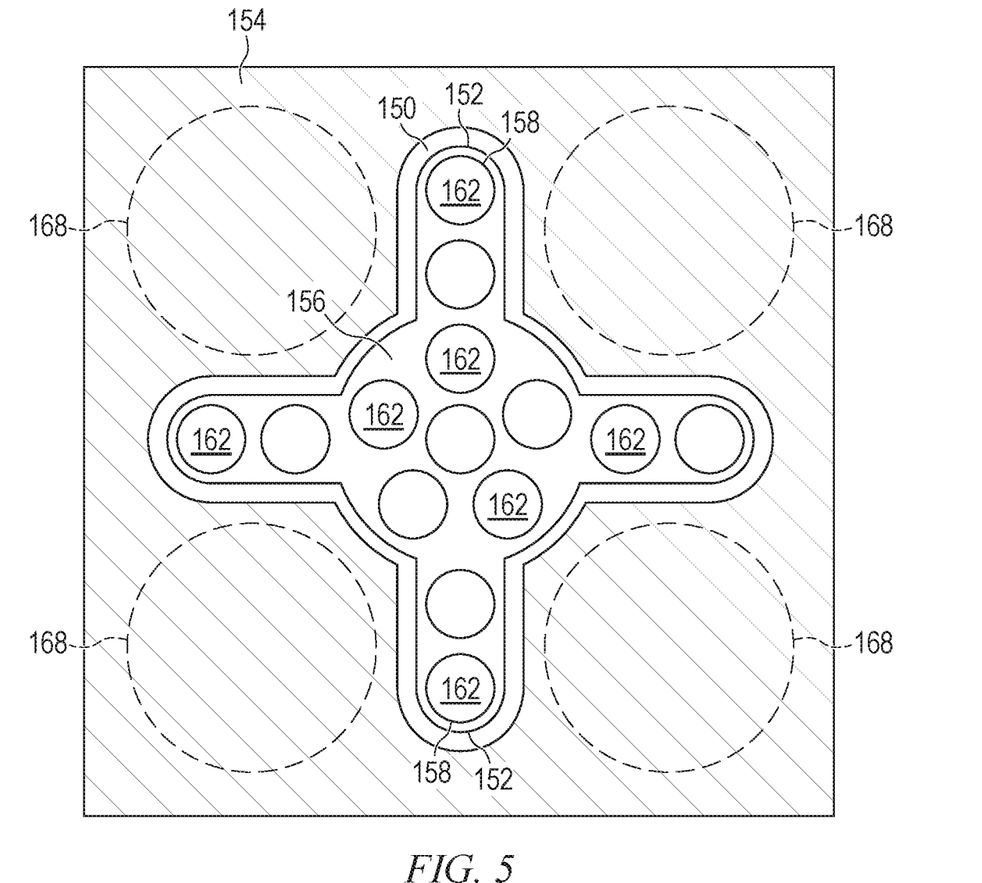
FIG. 5 illustrates another pattern of the dummy vias between or adjacent to bumps.

FIG. 5 is a top view of yet another embodiment of insulating layer 150, conductive layer 154, dummy vias 158 formed in insulating layer 156, dummy vias 158 filled with insulating layer 162, and bumps 168. FIG. 5 serves to illustrate how the pattern of dummy vias 158 between or adjacent to bumps 168 can vary to achieve a reduction of the metal areas, e.g., conductive layer 154. In this case, dummy vias 158 are in part arranged in a cross pattern within designated via formation area 152, adjacent to bumps 168. Bumps 168 are shown as a point of reference.

Dummy vias 158, as formed in insulating layer 156 around bumps 168, and then filled with insulating layer 162, as shown in FIGS. 3-5, serve to reduce interlayer delamination due to interface locking between similar layers. Conductive layer 154 has a higher metal area, due to its function to provide power supply voltages. Dummy vias 158 provide a locking effect for insulating layers 150, 156, and 162, leading to less metal coverage and less stress. In a multi-level interconnect design, additional conductive layers like 160 and insulating layers like 162 can be formed to provide the electrical interconnect capability necessary for the circuits formed within active surface 110. The stress relief and delamination improvement is more prominent for multi-layer RDL design with dummy vias existence between or adjacent to bumps, inferring from the reduction of Cu density gap ratio while presenting the locking effect.

Figure 6:
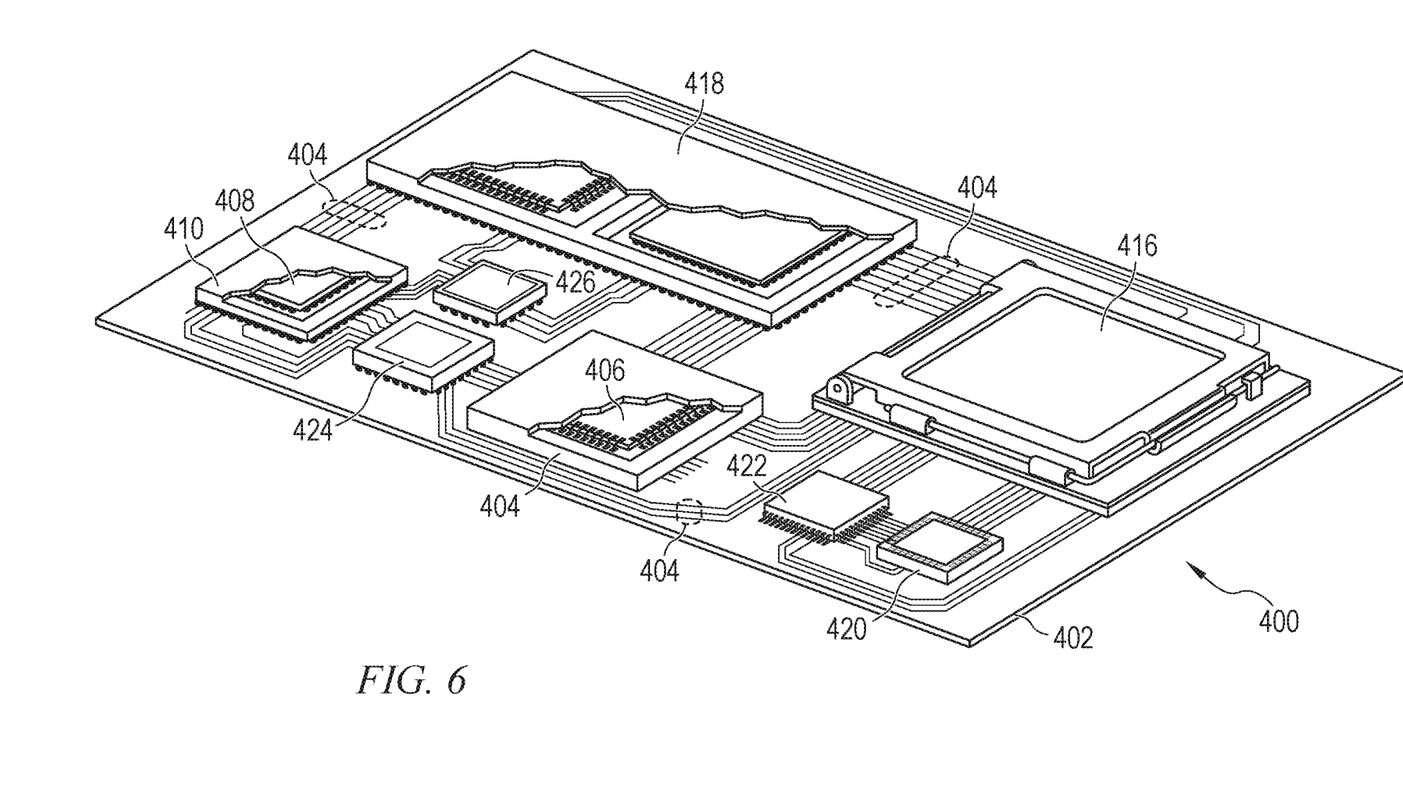
FIG. 6 illustrates a printed circuit board (PCB) with different types of packages disposed on a surface of the PCB.

FIG. 6 illustrates electrical device 400 having a chip carrier substrate or PCB 402 with a plurality of semiconductor packages disposed on a surface of PCB 402, including semiconductor die 104. Electrical device 400 can have one type of semiconductor package, or multiple types of semiconductor packages, depending on the application.

Electrical device 400 can be a stand-alone system that uses the semiconductor packages to perform one or more electrical functions. Alternatively, electrical device 400 can be a subcomponent of a larger system. For example, electrical device 400 can be part of a tablet, cellular phone, digital camera, communication system, or other electrical device. Alternatively, electrical device 400 can be a graphics card, network interface card, or other signal processing card that can be inserted into a computer. The semiconductor package can include microprocessors, memories, ASIC, logic circuits, analog circuits, RF circuits, discrete devices, or other semiconductor die or electrical components. Miniaturization and weight reduction are essential for the products to be accepted by the market. The distance between semiconductor devices may be decreased to achieve higher density.

In FIG. 6, PCB 402 provides a general substrate for structural support and electrical interconnect of the semiconductor packages disposed on the PCB. Conductive signal traces 404 are formed over a surface or within layers of PCB 402 using evaporation, electrolytic plating, electroless plating, screen printing, or other suitable metal deposition process. Signal traces 404 provide for electrical communication between each of the semiconductor packages, mounted components, and other external system components. Traces 404 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically disposed directly on the PCB. For the purpose of illustration, several types of first level packaging, including bond wire package 406 and flipchip 408, are shown on PCB 402. Additionally, several types of second level packaging, including ball grid array (BGA) 410, bump chip carrier (BCC) 412, land grid array (LGA) 416, multi-chip module (MCM) or SIP module 418, quad flat non-leaded package (QFN) 420, quad flat package 422, embedded wafer level ball grid array (eWLB) 424, and wafer level chip scale package (WLCSP) 426 are shown disposed on PCB 402. In one embodiment, eWLB 424 is a fan-out wafer level package (Fo-WLP) and WLCSP 426 is a fan-in wafer level package (Fi-WLP). Depending upon the system requirements, any combination of semiconductor packages, configured with any combination of first and second level packaging styles, as well as other electrical components, can be connected to PCB 402. In some embodiments, electrical device 400 includes a single attached semiconductor package, while other embodiments call for multiple interconnected packages. By combining one or more semiconductor packages over a single substrate, manufacturers can incorporate pre-made components into electrical devices and systems. Because the semiconductor packages include sophisticated functionality, electrical devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a semiconductor substrate;
   forming a first conductive layer over a surface of the semiconductor substrate;
   forming a first insulating layer over the surface of the semiconductor substrate and first conductive layer;
   forming a dummy via through the first insulating layer and extending past the first conductive layer to the surface of the semiconductor substrate between a first portion of the first conductive layer and a second portion of the first conductive layer with no overlap between a vertical projection of the dummy via and the first conductive layer;
   forming a second insulating layer over the first insulating layer to fill the dummy via; and
   forming a second conductive layer over the second insulating layer and electrically connected to the first conductive layer.

2. The method of claim 1, further including forming a bump over the second conductive layer adjacent to the dummy via filled with the second insulating layer.

3. The method of claim 1, wherein the dummy via filled with the second insulating layer relieves stress on the first conductive layer.

4. The method of claim 3, further including forming a cutout in the first conductive layer.

5. The method of claim 1, further including forming a plurality of dummy vias filled with the second insulating layer within a designated via formation area.

6. The method of claim 1, further including forming a plurality of dummy vias filled with the second insulating layer in a pattern.

7. A method of making a semiconductor device, comprising:
   providing a semiconductor substrate;
   forming a first conductive layer over a surface of the semiconductor substrate;
   forming a first insulating layer over the surface of the semiconductor substrate and first conductive layer;
   forming a dummy via through the first insulating layer and extending past the first conductive layer to the surface of the semiconductor substrate between a first portion of the first conductive layer and a second portion of the first conductive layer; and
   forming a second insulating layer to fill the dummy via.

8. The method of claim 7, further including forming a bump over the second conductive layer adjacent to the dummy via filled with the second insulating layer.

9. The method of claim 8, further including forming a plurality of patterns of dummy vias filled with the second insulating layer adjacent to the bump.

10. The method of claim 7, wherein the dummy via filled with the second insulating layer relieves stress on the first conductive layer.

11. The method of claim 10, further including forming a cutout in the first conductive layer.

12. The method of claim 7, further including forming a plurality of dummy vias filled with the second insulating layer within a designated via formation area.

13. The method of claim 7, further including forming a plurality of dummy vias filled with the second insulating layer in a pattern.

14. A semiconductor device, comprising:
   a semiconductor substrate;
   a first conductive layer formed over a surface of the semiconductor substrate;
   a first insulating layer formed over the surface of the semiconductor substrate and first conductive layer;
   a dummy via formed through the first insulating layer and extending past the first conductive layer to the surface of the semiconductor substrate between a first portion of the first conductive layer and a second portion of the first conductive layer with no overlap between a vertical projection of the dummy via and the first conductive layer;

a second insulating layer formed over the first insulating layer to fill the dummy via; and a second conductive layer formed over the second insulating layer and electrically connected to the first conductive layer.

15. The semiconductor device of claim 14, further including a bump formed over the second conductive layer adjacent to the dummy via filled with the second insulating layer.

16. The semiconductor device of claim 14, wherein the dummy via filled with the second insulating layer relieves stress on the first conductive layer.

17. The semiconductor device of claim 16, further including a cutout formed in the first conductive layer.

18. The semiconductor device of claim 14, further including a plurality of dummy vias filled with the second insulating layer formed within a designated via formation area.

19. The semiconductor device of claim 14, further including a plurality of dummy vias filled with the second insulating layer formed in a pattern.

20. A semiconductor device, comprising:
a semiconductor substrate;
a first conductive layer formed over a surface of the semiconductor substrate;
a first insulating layer formed over the surface of the semiconductor substrate and first conductive layer;
a dummy via formed through the first insulating layer and extending past the first conductive layer to the surface of the semiconductor substrate between a first portion of the first conductive layer and a second portion of the first conductive layer;
a second insulating layer filling the dummy via; and
a second conductive layer formed over the second insulating layer.

21. The semiconductor device of claim 20, further including a bump formed over the second conductive layer adjacent to the dummy via filled with the second insulating layer.

22. The semiconductor device of claim 20, wherein the dummy via filled with the second insulating layer relieves stress on the first conductive layer.

23. The semiconductor device of claim 22, further including a cutout formed in the first conductive layer.

24. The semiconductor device of claim 20, further including a plurality of dummy vias filled with the second insulating layer formed within a designated via formation area.

25. The semiconductor device of claim 20, further including a plurality of dummy vias filled with the second insulating layer formed in a pattern.

26. A semiconductor device, comprising:
a substrate;
a first insulating layer formed over a surface of the substrate;
a dummy via formed through the first insulating layer and extending to the surface of the substrate;
a second insulating layer formed over the first insulating layer and extending into the dummy via; and
a first conductive layer formed over the second insulating layer.

27. The semiconductor device of claim 26, further including a bump formed over the first conductive layer adjacent to the dummy via filled with the second insulating layer.

28. The semiconductor device of claim 26, further including a second conductive layer formed over the surface of the substrate, wherein the second insulating layer within the dummy via relieves stress on the second conductive layer.

29. The semiconductor device of claim 28, further including a cutout formed in the second conductive layer.

30. The semiconductor device of claim 26, further including a plurality of dummy vias filled with the second insulating layer formed within a designated via formation area.

31. The semiconductor device of claim 28, wherein the dummy via extends past the second conductive layer to the surface of the substrate between a first portion of the second conductive layer and a second portion of the second conductive layer.

32. The semiconductor device of claim 28, wherein a vertical projection of the dummy via has no overlap with respect to the second conductive layer.

33. The semiconductor device of claim 20, wherein a vertical projection of the dummy via has no overlap with respect to the first conductive layer.

* * * * *